United States Patent
Matsuoka et al.

(10) Patent No.: US 7,928,447 B2
(45) Date of Patent: Apr. 19, 2011

(54) GAN CRYSTAL SUBSTRATE, FABRICATING METHOD OF GAN CRYSTAL SUBSTRATE, AND LIGHT-EMITTING DEVICE

(75) Inventors: Toru Matsuoka, Itami (JP); Kensaku Motoki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 962 days.

(21) Appl. No.: 11/487,321

(22) Filed: Jul. 17, 2006

(65) Prior Publication Data
US 2008/0012025 A1 Jan. 17, 2008

(51) Int. Cl.
*H01L 27/15* (2006.01)

(52) U.S. Cl. ............... 257/79; 257/103; 257/E25.019; 438/47

(58) Field of Classification Search ............... 257/103, 257/79; 438/47, 44
See application file for complete search history.

(56) References Cited

U.S. PATENT DOCUMENTS

| | | | | |
|---|---|---|---|---|
| 6,509,651 | B1 * | 1/2003 | Matsubara et al. | 257/461 |
| 2004/0211355 | A1 * | 10/2004 | Motoki et al. | 117/19 |
| 2006/0264011 | A1 * | 11/2006 | Hachigo et al. | 438/483 |

FOREIGN PATENT DOCUMENTS

| | | | |
|---|---|---|---|
| JP | 2000-12900 | | 1/2000 |
| JP | 2000-022212 | | 1/2000 |
| JP | 2000022212 | A * | 1/2000 |
| JP | 2002-299252 | | 10/2002 |
| JP | 2002-368261 | | 12/2002 |

OTHER PUBLICATIONS

Japanese Notice of Grounds of Rejection, w/ English a translation thereof, issued in Japanese Patent Application No. JP 2004-020078 dated on Nov. 18, 2008.

* cited by examiner

*Primary Examiner* — Jerome Jackson, Jr.
*Assistant Examiner* — Dale Page
(74) *Attorney, Agent, or Firm* — McDermott Will & Emery LLP

(57) ABSTRACT

A GaN crystal substrate is provided, which has a diameter of not less than 20 mm and a thickness of not less than 70 μm and not more than 450 μm, and has a light absorption coefficient of not less than 7 $cm^{-1}$ and not more than 68 $cm^{-1}$ for light in the wavelength range of not less than 375 nm and not more than 500 nm. A fabricating method of the GaN crystal substrate, and a light-emitting device fabricated using the GaN crystal substrate are also provided.

8 Claims, 5 Drawing Sheets

(a)

(b)

(c)

(d)

(e)

GAN CRYSTAL SUBSTRATE, FABRICATING METHOD OF GAN CRYSTAL SUBSTRATE, AND LIGHT-EMITTING DEVICE

BACKGROUND OF THE INVENTION

1. Field of the Invention

The present invention relates to a GaN (gallium nitride) crystal substrate, a fabricating method of the GaN crystal substrate, and a light-emitting device. More particularly, the present invention relates to a GaN crystal substrate having a small absorption coefficient of light, a fabricating method of the GaN crystal substrate, and a light-emitting device increased in optical output that is fabricated using the GaN crystal substrate.

2. Description of the Background Art

Currently, a sapphire substrate or a GaN crystal substrate is primarily used as a substrate for a light-emitting device such as a light-emitting diode (hereinafter, "LED"), a laser diode (hereinafter, "LD") and the like.

SUMMARY OF THE INVENTION

In the case where a sapphire substrate is used as the substrate for a light-emitting device, it is not possible to form an electrode on a back surface of the sapphire substrate (opposite to the surface (growth surface) on which semiconductor layers including a light-emitting layer are grown), due to high insulating property of the sapphire substrate.

Thus, in such a case, it is necessary to form the electrode on a surface of a thin semiconductor layer, such as an n-type GaN layer, grown on the growth surface of the sapphire substrate. In this case, however, the driving voltage of the light-emitting device would increase, since the current would flow into the electrode through the small cross section of the thin semiconductor layer.

Meanwhile, in the case where a conductive GaN crystal substrate, such as an n-type GaN crystal substrate, is used as the substrate for a light-emitting device, it is possible to form the electrode on the back surface of the GaN crystal substrate having a large cross section, and thus, the driving voltage of the light-emitting device can be reduced compared to the case of using the sapphire substrate.

However, if the GaN crystal substrate is used as the substrate for a blue LED made of a nitride semiconductor, for example, the light emitted from a light-emitting layer of the blue LED and traveling toward the GaN crystal substrate side would be absorbed by the GaN crystal substrate in a greater amount, because the GaN crystal substrate has a light absorption coefficient higher than that of the sapphire substrate for the light emitted from the light-emitting layer of the blue LED. This would degrade the optical output.

Japanese Patent Laying-Open No. 2000-012900, for example, discloses a GaN crystal substrate having a reduced light absorption coefficient for light in the wavelength range from 400 nm to 600 nm. However, further improvement is desired.

Japanese Patent Laying-Open No. 2002-368261 discloses an LED increased in optical output by providing unevenness to the back surface of the substrate for the light-emitting device. The optical output however is still insufficient.

In view of the foregoing, an object of the present invention is to provide a GaN crystal substrate having a small absorption coefficient of light, a fabricating method of the GaN crystal substrate, and a light-emitting device increased in optical output that is fabricated using the GaN crystal substrate.

The present invention provides a GaN crystal substrate having a diameter of not less than 20 mm and a thickness of not less than 70 μm and not more than 450 μm, wherein the GaN crystal substrate has a light absorption coefficient of not less than 7 cm$^{-1}$ and not more than 68 cm$^{-1}$ for light in a wavelength range of not less than 375 nm and not more than 500 nm. It is noted that the diameter means the longest length among the lengths of straight lines joining two arbitrary points on the periphery of the largest surface of the GaN crystal substrate.

Here, the GaN crystal substrate of the present invention preferably has a carrier concentration of not less than $5\times10^{17}$ cm$^{-3}$ and not more than $2\times10^{19}$ cm$^{-3}$.

Further, the GaN crystal substrate of the present invention preferably includes at least one element selected from the group consisting of oxygen (hereinafter, "O"), carbon (hereinafter, "C"), sulfur (hereinafter, "S") and silicon (hereinafter, "Si"), as a dopant.

Further, the GaN crystal substrate of the present invention preferably has a surface having surface roughness Ra of not more than 10 nm.

The present invention also provides a method for fabricating the above-described GaN crystal substrate, including the steps of: forming a mask layer having an opening on a GaAs substrate; growing at least two GaN buffer layers on a surface of the GaAs substrate exposed at the opening; epitaxially growing a GaN crystal layer on the GaN buffer layers by HVPE; and removing the GaAs substrate.

Furthermore, the present invention provides a light-emitting device fabricated by a method including the step of forming at least one III group nitride semiconductor layer on the above-described GaN crystal substrate.

According to the present invention, it is possible to provide a GaN crystal substrate having a small absorption coefficient of light, a fabricating method of the GaN crystal substrate, and a light-emitting device increased in optical output that is fabricated using the GaN crystal substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
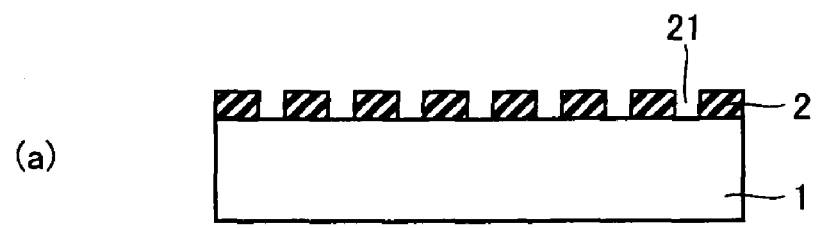
FIG. 1 is a schematic cross sectional view showing an example of a fabricating method of a GaN crystal substrate of the present invention.
Figure 1:
Figure 1:
Figure 1:
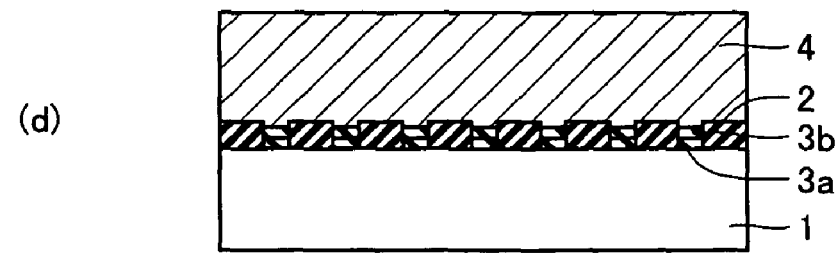
Figure 1:
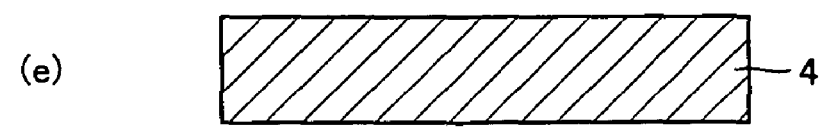

Hereinafter, an embodiment of the present invention will be described. In the drawings, the same reference characters denote the same or corresponding portions.

The GaN crystal substrate of the present invention has a diameter of not less than 20 mm and a thickness of not less than 70 μm and not more than 450 μm, and is characterized in that it has a light absorption coefficient of not less than 7 cm$^{-1}$ and not more than 68 cm$^{-1}$ for light in the wavelength range of not less than 375 nm and not more than 500 nm.

If the diameter of the GaN crystal substrate is less than 20 mm, productivity of the GaN crystal substrate would likely be degraded. If the thickness of the GaN crystal substrate is less than 70 μm, mechanical strength of the GaN crystal substrate would likely be lowered. If the thickness of the GaN crystal substrate exceeds 450 μm, the amount of light absorbed by the GaN crystal substrate would likely increase. Further, when the thickness of the GaN crystal substrate is 200 μm or more, mechanical strength of the GaN crystal substrate tends to improve, and its handling tends to become easier as well. Accordingly, it is preferable that the GaN crystal substrate of the present invention has the thickness of not less than 200 μm and not more than 450 μm.

Further, if the GaN crystal substrate has the light absorption coefficient of less than 7 cm$^{-1}$ for the light in the wavelength range of not less than 375 nm and not more than 500 nm, the carrier concentration of the GaN crystal substrate would be small, and the electric resistance thereof would be large, leading to a large driving voltage of the light-emitting device. If the GaN crystal substrate has the light absorption coefficient exceeding 68 cm$^{-1}$ for the light in the wavelength range of not less than 375 nm and not more than 500 nm, the GaN crystal substrate would absorb the light too much, which would degrade the optical output of the light-emitting device. It is noted that the light absorption coefficient becomes greater as the wavelength of the light is shorter for the same GaN crystal substrate, since the energy of light is greater with the shorter wavelength of light.

Here, the light absorption coefficient α of the GaN crystal substrate is represented by the following formula (1):

$$\alpha = -(1/H)\ln(I/I_0) \tag{1}$$

In the formula (1), $I_0$ represents intensity of incident light, I represents intensity of transmitted light, i.e., the incident light having transmitted through the GaN crystal substrate, and H represents a thickness of the GaN crystal substrate. Further, ln is a logarithm natural.

It is preferable that the GaN crystal substrate of the present invention has the carrier concentration of not less than 5×10$^{17}$ cm$^{-3}$ and not more than 2×10$^{19}$ cm$^{-3}$. If the carrier concentration of the GaN crystal substrate is less than 5×10$^{17}$ cm$^{-3}$, the electric resistance of the GaN crystal substrate would be large, leading to a large driving voltage of the light-emitting device. If the carrier concentration of the GaN crystal substrate exceeds 2×10$^{19}$ cm$^{-3}$, the number of levels other than the donor level within the band gap would increase as well, leading to an increase of the light absorption coefficient of the GaN crystal substrate.

It is preferable that the GaN crystal substrate of the present invention includes at least one element selected from the group consisting of O, C, S and Si, as a dopant. By doping of the GaN crystal substrate, O or S enters the N site of the GaN crystal, while S or Si enters the Ga site of the GaN crystal, which can reduce the electric resistance of the GaN crystal substrate.

It is preferable that a surface of the GaN crystal substrate of the present invention has surface roughness Ra of not more than 10 nm. If the surface roughness Ra of the surface of the GaN crystal substrate is more than 10 nm, crystallinity of a semiconductor layer formed on the relevant surface would be degraded, leading to degradation of the properties of the light-emitting device. Here, the surface roughness Ra refers to the arithmetic average roughness Ra as defined in JIS B 0601. It is noted that the surface roughness Ra of the surface of the GaN crystal substrate can be decreased by polishing the surface by MP (Mechanical Polishing) or CMP (Chemical Mechanical Polishing) method.

The GaN crystal substrate of the present invention may be fabricated, e.g., in the following manner. Firstly, as shown in FIG. 1(a), a mask layer 2 having, e.g., dot-shaped or stripe-shaped openings 21 is formed on a GaAs substrate 1. Dot-shaped opening 21 may have a circular shape or polygonal shape. In the case where GaAs substrate 1 is made of GaAs crystal of cubic type, the (111) A plane or the (111) B plane, for example, may be used as the crystal growth surface. Here, the A plane refers to the plane from which Ga atoms are exposed, while the B plane refers to the plane from which As atoms are exposed.

Mask layer 2 may be formed, e.g., by applying a mask material on the surface of GaAs substrate 1 and then partially removing the mask material by photo etching to form openings 21. Here, the mask material may be, e.g., Si$_3$N$_4$ or SiO$_2$. Further, mask layer 2 may have a thickness of, e.g., not less than 100 nm and not more than 300 nm.

Figure 2:
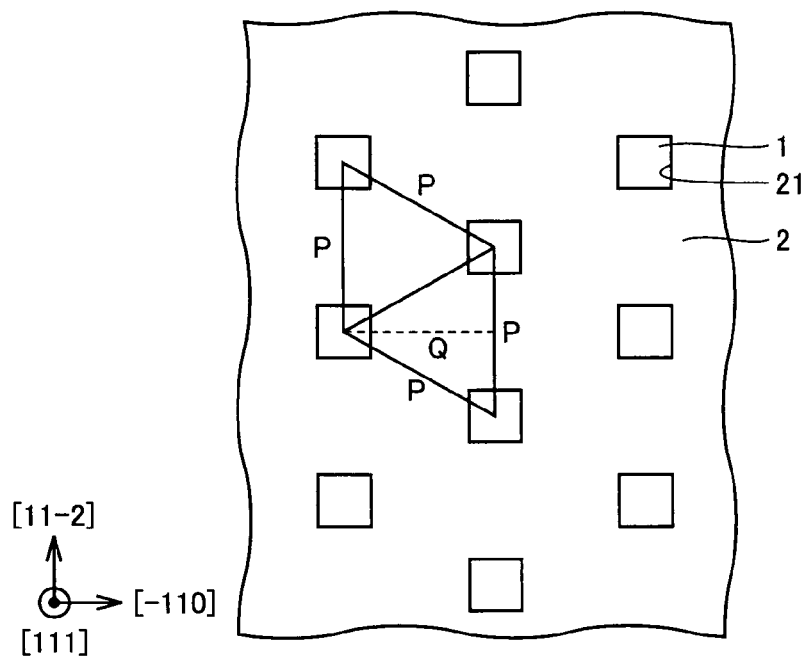
FIG. 2 is a schematic top plan view showing, by way of example, arrangement of openings formed in a mask layer, in the fabricating method of the GaN crystal substrate of the present invention.

As shown, e.g., in FIG. 2, dot-shaped openings 21 are arranged at predetermined intervals P in straight lines in the [11-2] direction on the (111) A plane of GaAs substrate 1, and the straight lines of the openings are arranged at predetermined intervals Q in the [-110] direction. The positions of openings 21 in the neighboring straight lines are shifted by P/2 from each other.

Figure 3:
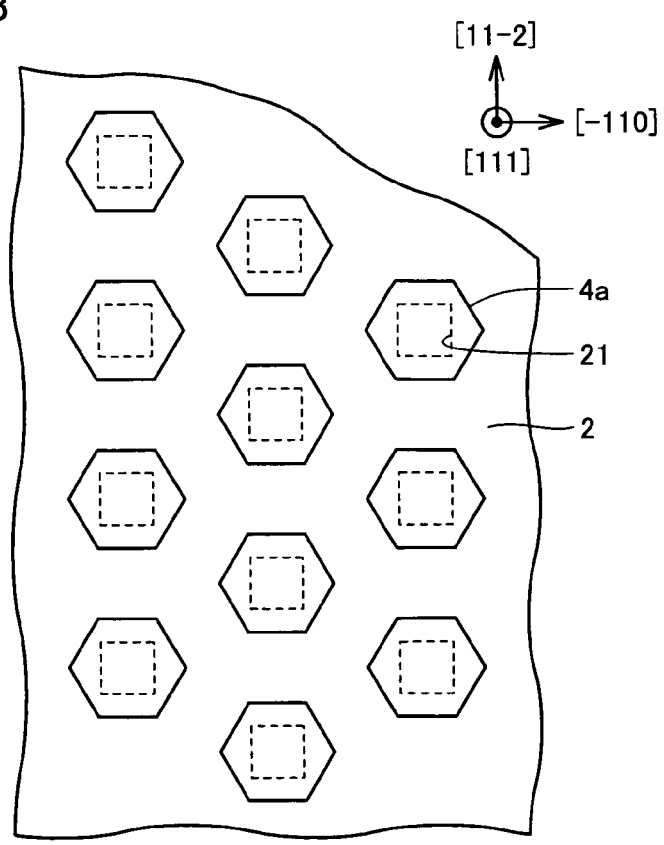
FIG. 3 is a schematic top plan view showing, by way of example, the state after a GaN single-crystal layer grows on the openings shown in FIG. 2, in the fabricating method of the GaN crystal substrate of the present invention.

Here, interval Q preferably satisfies the relation of: Q=3$^{1/2}$×P/2. In this case, openings 21 are arranged such that the center of each opening 21 is located at the apex of an equilateral triangle having a side with a length of P, as shown in FIG. 2 for example. When openings 21 are arranged in this manner, in the case where a GaN single-crystal layer is to be grown after at least two GaN buffer layers are grown on the (111) A plane of GaAs substrate 1 exposed from openings 21, a GaN single crystal 4a will grow into a hexagonal column, as shown in FIG. 3 for example, because of the hexagonal crystal structure of GaN. As GaN single crystal 4a grows, it comes into contact with the neighboring GaN single crystals, as shown in FIG. 4 for example, which then grow together in the [111] direction.

Although the case of using mask layer 2 having dot-shaped openings 21 has been described above, in the case of using a mask layer 2 having stripe-shaped openings 21, openings 21 may be formed to extend, e.g., in the [11-2] direction or the [-110] direction.

Figure 4:
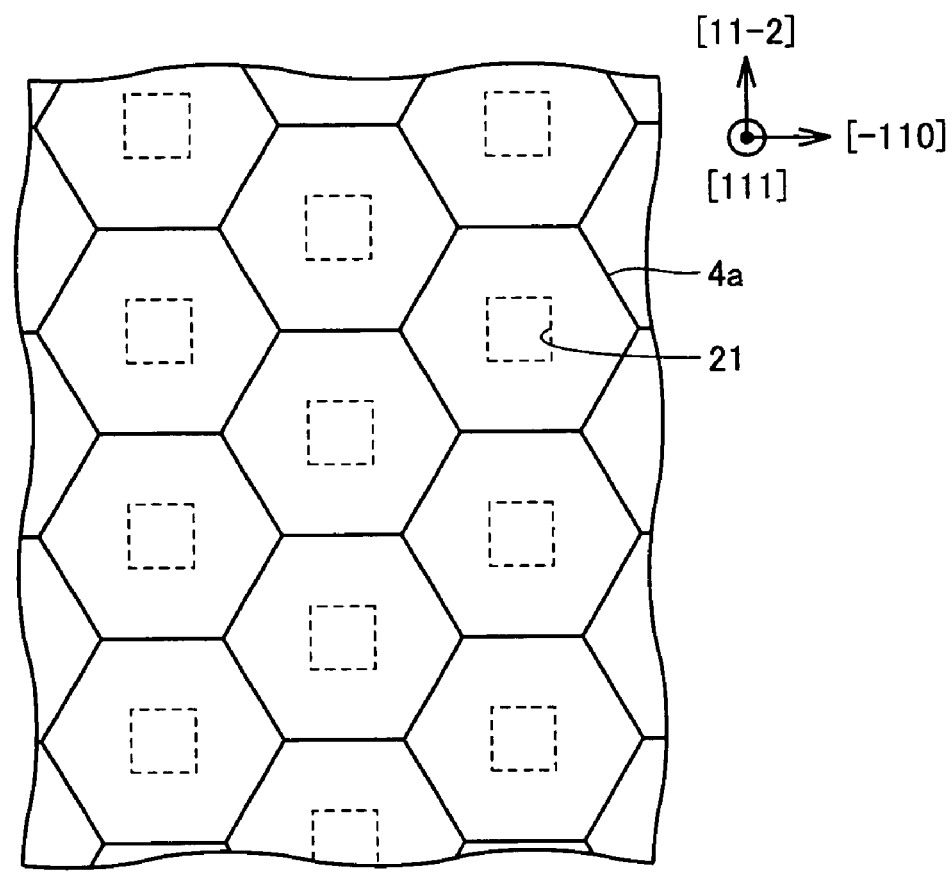
FIG. 4 is a schematic top plan view showing, by way of example, the state after the GaN single-crystal layer shown in FIG. 3 further grows, in the fabricating method of the GaN crystal substrate of the present invention.

Further, in FIGS. 2-4, the [11-2] direction corresponds to the direction from the bottom to the top in the paper plane, the [-110] direction corresponds to the direction from the left to the right in the paper plane, and the [111] direction corresponds to the direction from the back to the front in the paper plane.

Next, a first GaN buffer layer 3a is grown on the surface of GaAs substrate 1 exposed from opening 21, as shown in FIG. 1(b). Subsequently, a second GaN buffer layer 3b is grown on first GaN buffer layer 3a, as shown in FIG. 1(c). It is noted that in the present invention, an additional GaN buffer layer may be grown on second GaN buffer layer 3b.

Here, the GaN buffer layers such as first GaN buffer layer 3a and second GaN buffer layer 3b may be grown by using a vapor deposition method such as HVPE, MOCVD (Metal Organic Chemical Vapor Deposition) or MOC (Metal Organic Chloride) method. Further, the GaN buffer layers may be formed by growing amorphous layers of GaN at a low temperature atmosphere of 400° C. to 600° C. by the above-described vapor deposition method.

Next, as shown in FIG. 1(d), a GaN single crystal is epitaxially grown on second GaN buffer layer 3b, preferably by HVPE, to form a GaN crystal layer 4. Here, as the way of growing the GaN single crystal, MOCVD or MOC may be used besides HVPE. However, for MOCVD or MOC, an organometallic compound of Ga, such as TMG (trimethyl gallium), is used as the raw material, in which case a great amount of C would be mixed into the GaN single crystal, leading to a larger light absorption coefficient of the GaN single crystal. In contrast, when HVPE is used, the organometallic compound of Ga is not used, and accordingly, mixing of C into the GaN single crystal can be suppressed advantageously. Further, when HVPE is used, the growth rate of the crystal is greater than in the case of using MOCVD or MOC, and thus, the GaN single crystal can be grown more efficiently.

Figure 5:
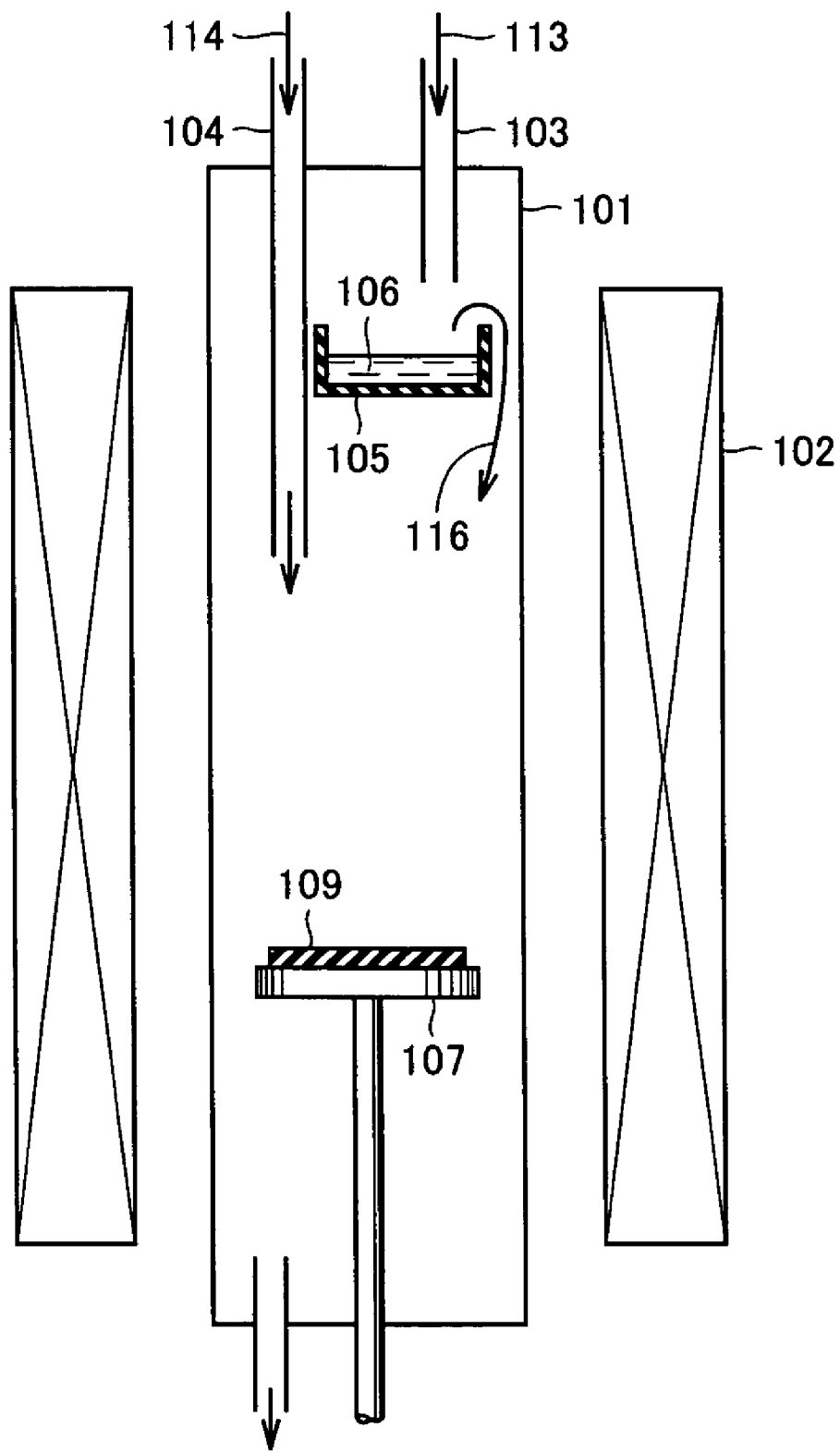
FIG. 5 shows a schematic configuration of an example of an HVPE apparatus used in the fabricating method of the GaN crystal substrate of the present invention.

The GaN single crystal may be epitaxially grown by HVPE for example in the following manner. FIG. 5 shows a schematic configuration of an example of an HVPE apparatus used in the present invention. Referring to FIG. 5, HCl gas 113 is introduced into a hot-wall type reactor 101 surrounded with a cylindrical heater 102, via a source gas inlet 103 provided at the top of the reactor. HCl gas 113 is reacted with a Ga melt 106 in a vessel 105 to be GaCl gas 116. $NH_3$ gas 114 introduced via a source gas inlet 104 provided at the top of reactor 101 is reacted with GaCl gas 116, so that a GaN single crystal grows on a GaAs substrate 109, with the GaN buffer layers formed thereon, that is arranged on a susceptor 107. From the standpoint of control of reactivity, HCl gas 113 and $NH_3$ gas 114 serving as the source gases are generally mixed with carrier gas, such as $H_2$ gas, before being introduced. It is noted that when the GaN buffer layer is amorphous, the GaN buffer layer tends to crystallize when a GaN single crystal is epitaxially grown by HVPE at a high ambient temperature of not lower than 800° C. and not higher than 1050° C.

Next, as shown in FIG. 1(e), GaAs substrate 1, mask layer 2, first GaN buffer layer 3a, and second GaN buffer layer 3b are removed to obtain a GaN crystal layer 4. The GaN crystal substrate of the present invention is obtained by processing this GaN crystal layer 4, for example by slicing it into a predetermined thickness.

As described above, in the present invention, at least two GaN buffer layers are grown, which can improve crystallinity of GaN crystal layer 4 that is to be grown on the Ga buffer layers. In the GaN crystal substrate of the present invention made of GaN crystal layer 4 thus improved in crystallinity, the levels absorbing light therein decrease in concentration, so that it may be possible to decrease the light absorption coefficient of the inventive GaN crystal substrate.

A light-emitting device may be obtained, e.g., by forming at least one III group nitride semiconductor layer including a light-emitting layer on the GaN crystal substrate of the present invention, and then dividing it into chips.

It is noted that GaAs substrate 1 may be removed by etching using aqua regia, for example. Further, mask layer 2, first GaN buffer layer 3a and second GaN buffer layer 3b may be removed by polishing, for example.

GaN crystal layer 4 obtained as described above shows n-type conductivity even in the case where it is not doped with any element of O, C, S or Si. However, doping with at least one element selected from the group consisting of O, C, S and Si can further decrease the electric resistance of the GaN crystal substrate of the present invention.

EXAMPLES

Example 1

1. Fabrication of GaN Crystal Substrate

Firstly, on a GaAs substrate 1 having a diameter of 50 mm, a $Si_3N_4$ layer having a thickness of 100 nm was formed as a mask layer 2 by CVD under the atmospheric pressure, as shown in FIG. 1(a).

Thereafter, openings 21 were formed at mask layer 2 by photo etching to have centers corresponding to apexes of triangles with P of 4 μm and Q of 3.5 μm shown in FIG. 2. Here, opening 21 was shaped into a quadrate with a side of 1 μm.

Next, as shown in FIG. 1(b), a first GaN buffer layer 3a was grown to a thickness of 40 nm on the surface of GaAs substrate 1 exposed from openings 21 by HVPE, using HCl gas (partial pressure: 60.8 Pa) and $NH_3$ gas (partial pressure: $1.31 \times 10^4$ Pa) as the source gases, at the ambient temperature of 475° C.

Subsequently, as shown in FIG. 1(c), a second GaN buffer layer 3b was grown to a thickness of 40 nm on first GaN buffer layer 3a by HVPE, using HCl gas (partial pressure: 60.8 Pa) and $NH_3$ gas (partial pressure: $1.31 \times 10^4$ Pa) as the source gases, at the ambient temperature of 500° C.

Next, as shown in FIG. 1(d), a GaN crystal layer 4 was formed by growing a GaN single crystal to a thickness of 450 μm on second GaN buffer layer 3b by HVPE, using, as the source gases, HCl gas (partial pressure: $1.25 \times 10^3$ Pa) and $NH_3$ gas (partial pressure: $1.31 \times 10^4$ Pa) as well as mixed gas of $O_2$ and $N_2$ (partial pressure: 23.4 Pa) containing 0.1 mass % of $O_2$, at the ambient temperature of 1000° C.

It is noted that HCl gas was reacted with a Ga melt in the vessel in the HVPE apparatus used in Example 1 to be GaCl gas, and then the GaCl gas was reacted with $NH_3$ gas, so that first GaN buffer layer 3a, second GaN buffer layer 3b and GaN crystal layer 4 were grown.

Next, GaAs substrate 1 was etched away by immersing it in aqua regia, and mask layer 2, first GaN buffer layer 3a and second GaN buffer layer 3b were removed by MP, to thereby obtain GaN crystal layer 4, as shown in FIG. 1(e).

Thereafter, GaN crystal layer 4 was sliced and the surface was polished by CMP, whereby the GaN crystal substrate of Example 1 having a surface with surface roughness Ra of 3 nm, a diameter of 50 mm and a thickness of 250 μm, was obtained.

The carrier concentration and the light absorption coefficient of the GaN crystal substrate of Example 1 thus obtained were evaluated. The results are shown in Table 1.

As shown in Table 1, the GaN crystal substrate of Example 1 had the carrier concentration of $5 \times 10^{17}$ cm$^{-3}$, and the absorption coefficient of light of 375 nm wavelength was 34 cm$^{-1}$, and the absorption coefficient of light of 500 nm wavelength was 7 cm$^{-1}$. Since the light absorption coefficient becomes greater as the wavelength of the light is shorter for the same GaN crystal substrate as described above, it has been confirmed that the GaN crystal substrate of Example 1 has the light absorption coefficient of not less than 7 cm$^{-1}$ and not more than 34 cm$^{-1}$ for the light in the wavelength range of not less than 375 nm and not more than 500 nm.

It is noted that the carrier concentration of the GaN crystal substrate of Example 1 was measured at room temperature (23° C.) by using the van der Pauw's method, and the light absorption coefficient was measured by using a spectrophotometer.

2. Fabrication of LED

Figure 6:
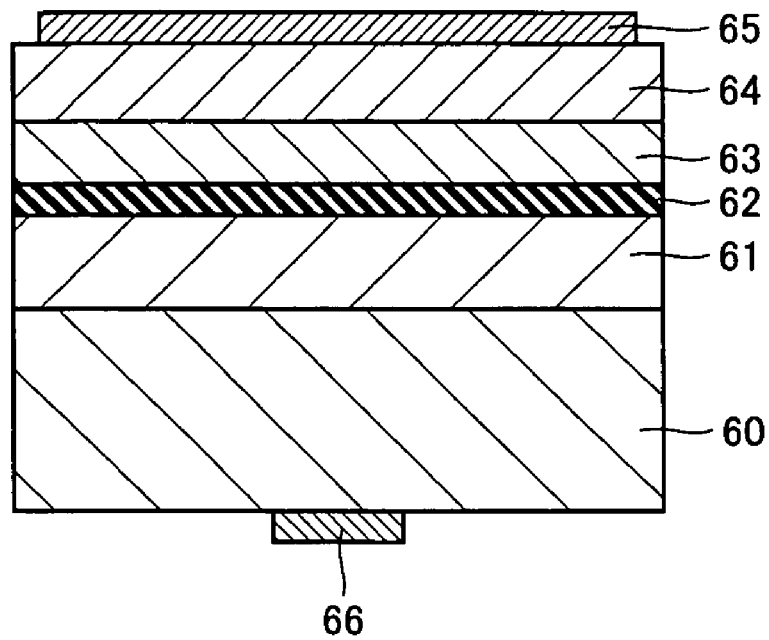
FIG. 6 is a schematic cross sectional view showing a configuration of an LED of Examples 1-4 and Comparative Examples 1-2.

FIG. 6 shows a schematic cross sectional view of a configuration of an LED of Example 1. Here, the LED of Example 1 is configured such that a 1.5 μm-thick n-type GaN layer 61, a multiple quantum well active layer 62 having 3 nm-thick In$_{0.2}$Ga$_{0.8}$N layer and 15 nm-thick GaN layer stacked alternately in five layers, a 30 nm-thick p-type Al$_{0.15}$Ga$_{0.85}$N layer 63, and a 100 nm-thick p-type GaN layer 64 are stacked in this order on the surface of the GaN crystal substrate 60 of Example 1, and a stack of Au layer and Ni layer is formed on p-type GaN layer 64 as a p-side electrode 65 (with the Au layer arranged on the p-type GaN layer 64 side), and a stack of Ti layer and Al layer is formed on the back surface (opposite to the surface) of GaN crystal substrate 60 as an n-side electrode 66 (with the Ti layer arranged on the GaN crystal substrate 60 side).

The LED of Example 1 having the above configuration was fabricated in the following manner. Firstly, on the surface of GaN crystal substrate 60 of Example 1, n-type GaN layer 61, multiple quantum well active layer 62, p-type Al$_{0.15}$Ga$_{0.85}$N layer 63, and p-type GaN layer 64 were stacked in this order by MOCVD.

Next, p-side electrode 65 was formed on p-type GaN layer 64. Subsequently, the back surface of GaN crystal substrate 60 of Example 1 was lapped by CMP to adjust the thickness of GaN crystal substrate 60 of Example 1 to 200 μm.

Next, at the back surface of GaN crystal substrate 60 of Example 1, cylindrical n-side electrode 66 having a diameter of 80 μm was formed at the center of each of a plurality of quadrates partitioned to have a width of 300 μm and a length of 300 μm.

Thereafter, GaN crystal substrate 60 of Example 1, provided with the above-described semiconductor layers, p-side electrode 65 and n-side electrode 66, was divided into chips along the boundaries of the plurality of quadrates, whereby the LED of Example 1 was obtained.

The driving voltage and the optical output of the LED of Example 1 were evaluated. The results are shown in Table 1. As shown in Table 1, the driving voltage of the LED of Example 1 for 20 mA was 3.3 V, and the optical output of the light having the emission wavelength of 460 nm was 4.8 mW.

Example 2

A GaN crystal substrate of Example 2 was fabricated in a similar manner and under similar conditions as in Example 1, except that mixed gas of O$_2$ and N$_2$ (partial pressure: 6.55×10$^2$ Pa) containing 0.1 mass % of O$_2$ as well as HCl gas (partial pressure: 1.25×10$^3$ Pa) and NH$_3$ gas (partial pressure: 1.31×10$^4$ Pa) were used as the source gases. The surface of the GaN crystal substrate of Example 2 had surface roughness Ra of 3 nm.

For the GaN crystal substrate of Example 2 thus obtained, the carrier concentration and the light absorption coefficient were evaluated in a similar manner and under similar conditions as in Example 1. The results are shown in Table 1.

As shown in Table 1, the GaN crystal substrate of Example 2 had the carrier concentration of 2×10$^{19}$ cm$^{-3}$, and the absorption coefficient of light of 375 nm wavelength was 68 cm$^{-1}$, and the absorption coefficient of light of 500 nm wavelength was 10 cm$^{-1}$. Since the light absorption coefficient becomes greater as the wavelength of the light is shorter for the same GaN crystal substrate as described above, it has been confirmed that the GaN crystal substrate of Example 2 has the light absorption coefficient of not less than 10 cm$^{-1}$ and not more than 68 cm$^{-1}$ for the light in the wavelength range of not less than 375 nm and not more than 500 nm.

Further, an LED of Example 2 was fabricated in a similar manner and under similar conditions as in the LED of Example 1, except that the GaN crystal substrate of Example 2 was used instead of the GaN crystal substrate of Example 1.

The driving voltage and the optical output of the LED of Example 2 were evaluated in a similar manner and under similar conditions as in the case of the LED of Example 1. The results are shown in Table 1. As shown in Table 1, the driving voltage of the LED of Example 2 for 20 mA was 3.2 V, and the optical output of the light having the emission wavelength of 460 nm was 3.5 mW.

Example 3

A GaN crystal substrate of Example 3 was fabricated in a similar manner and under similar conditions as in Example 1, except that mixed gas of SiH$_4$ and N$_2$ (partial pressure: 93.5 Pa) containing 0.1 mass % of SiH$_4$ as well as HCl gas (partial pressure: 1.25×10$^3$ Pa) and NH$_3$ gas (partial pressure: 1.31×10$^4$ Pa) were used as the source gases. The surface of the GaN crystal substrate of Example 3 had surface roughness Ra of 3 nm.

For the GaN crystal substrate of Example 3 thus obtained, the carrier concentration and the light absorption coefficient were evaluated in a similar manner and under similar conditions as in Example 1. The results are shown in Table 1.

As shown in Table 1, the GaN crystal substrate of Example 3 had the carrier concentration of 5×10$^{17}$ cm$^{-3}$, and the absorption coefficient of light of 375 nm wavelength was 35 cm$^{-1}$, and the absorption coefficient of light of 500 nm wavelength was 8 cm$^{-1}$. Since the light absorption coefficient becomes greater as the wavelength of the light is shorter for the same GaN crystal substrate as described above, it has been confirmed that the GaN crystal substrate of Example 3 has the light absorption coefficient of not less than 8 cm$^{-1}$ and not more than 35 cm$^{-1}$ for the light in the wavelength range of not less than 375 nm and not more than 500 nm.

Further, an LED of Example 3 was fabricated in a similar manner and under similar conditions as in the LED of Example 1, except that the GaN crystal substrate of Example 3 was used instead of the GaN crystal substrate of Example 1.

The driving voltage and the optical output of the LED of Example 3 were evaluated in a similar manner and under similar conditions as in the case of the LED of Example 1. The results are shown in Table 1. As shown in Table 1, the driving voltage of the LED of Example 3 for 20 mA was 3.3 V, and the optical output of the light having the emission wavelength of 460 nm was 4.7 mW.

Example 4

A GaN crystal substrate of Example 4 was fabricated in a similar manner and under similar conditions as in Example 1, except that mixed gas of H$_2$S and N$_2$ (partial pressure: 3.12×10$^2$ Pa) containing 1 mass % of H$_2$S as well as HCl gas (partial pressure: 1.25×10$^3$ Pa) and NH$_3$ gas (partial pressure: 1.31×10$^4$ Pa) were used as the source gases. The surface of the GaN crystal substrate of Example 4 had surface roughness Ra of 3 nm.

For the GaN crystal substrate of Example 4 thus obtained, the carrier concentration and the light absorption coefficient were evaluated in a similar manner and under similar conditions as in Example 1. The results are shown in Table 1.

As shown in Table 1, the GaN crystal substrate of Example 4 had the carrier concentration of $5 \times 10^{17}$ cm$^{-3}$, and the absorption coefficient of light of 375 nm wavelength was 39 cm$^{-1}$, and the absorption coefficient of light of 500 nm wavelength was 10 cm$^{-1}$. Since the light absorption coefficient becomes greater as the wavelength of the light is shorter for the same GaN crystal substrate as described above, it has been confirmed that the GaN crystal substrate of Example 4 has the light absorption coefficient of not less than 10 cm$^{-1}$ and not more than 39 cm$^{-1}$ for the light in the wavelength range of not less than 375 nm and not more than 500 nm.

Further, an LED of Example 4 was fabricated in a similar manner and under similar conditions as in the LED of Example 1, except that the GaN crystal substrate of Example 4 was used instead of the GaN crystal substrate of Example 1.

The driving voltage and the optical output of the LED of Example 4 were evaluated in a similar manner and under similar conditions as in the case of the LED of Example 1. The results are shown in Table 1. As shown in Table 1, the driving voltage of the LED of Example 4 for 20 mA was 3.4 V, and the optical output of the light having the emission wavelength of 460 nm was 4.5 mW.

Comparative Example 1

A GaN crystal substrate of Comparative Example 1 was fabricated in a similar manner and under similar conditions as in Example 1, except that HCl gas (partial pressure: $1.25 \times 10^3$ Pa) and NH$_3$ gas (partial pressure: $1.31 \times 10^4$ Pa) alone were used as the source gases. The surface of the GaN crystal substrate of Comparative Example 1 had surface roughness Ra of 3 nm.

For the GaN crystal substrate of Comparative Example 1 thus obtained, the carrier concentration and the light absorption coefficient were evaluated in a similar manner and under similar conditions as in Example 1. The results are shown in Table 1.

As shown in Table 1, the GaN crystal substrate of Comparative Example 1 had the carrier concentration of $1 \times 10^{17}$ cm$^{-3}$, and the absorption coefficient of light of 375 nm wavelength was 26 cm$^{-1}$, and the absorption coefficient of light of 500 nm wavelength was 4 cm$^{-1}$. As such, it has been confirmed that the GaN crystal substrate of Comparative Example 1 has the light absorption coefficient that does not fall within the range of not less than 7 cm$^{-1}$ and not more than 68 cm$^{-1}$ for the light in the wavelength range of not less than 375 nm and not more than 500 nm.

Further, an LED of Comparative Example 1 was fabricated in a similar manner and under similar conditions as in the LED of Example 1, except that the GaN crystal substrate of Comparative Example 1 was used instead of the GaN crystal substrate of Example 1.

The driving voltage and the optical output of the LED of Comparative Example 1 were evaluated in a similar manner and under similar conditions as in the case of the LED of Example 1. The results are shown in Table 1. As shown in Table 1, the driving voltage of the LED of Comparative Example 1 for 20 mA was 5.4 V, and the optical output of the light having the emission wavelength of 460 nm was 5.0 mW.

Comparative Example 2

A GaN crystal substrate of Comparative Example 2 was fabricated in a similar manner and under similar conditions as in Example 2, except that in the step of forming the GaN buffer layer, a 80-nm thick, first GaN buffer layer alone was grown using HCl gas (partial pressure: 60.8 Pa) and NH$_3$ gas (partial pressure: $1.31 \times 10^4$ Pa) as the source gases, at the ambient temperature of 500° C., without formation of a second GaN buffer layer. The surface of the GaN crystal substrate of Comparative Example 2 had surface roughness Ra of 3 nm.

For the GaN crystal substrate of Comparative Example 2 thus obtained, the carrier concentration and the light absorption coefficient were evaluated in a similar manner and under similar conditions as in Example 1. The results are shown in Table 1.

As shown in Table 1, the GaN crystal substrate of Comparative Example 2 had the carrier concentration of $2 \times 10^{19}$ cm$^{-3}$, and the absorption coefficient of light of 375 nm wavelength was 110 cm$^{-1}$, and the absorption coefficient of light of 500 nm wavelength was 25 cm$^{-1}$. As such, it has been confirmed that the GaN crystal substrate of Comparative Example 2 has the light absorption coefficient that does not fall within the range of not less than 7 cm$^{-1}$ and not more than 68 cm$^{-1}$ for the light in the wavelength range of not less than 375 nm and not more than 500 nm.

Further, an LED of Comparative Example 2 was fabricated in a similar manner and under similar conditions as in the LED of Example 1, except that the GaN crystal substrate of Comparative Example 2 was used instead of the GaN crystal substrate of Example 1.

The driving voltage and the optical output of the LED of Comparative Example 2 were evaluated in a similar manner and under similar conditions as in the case of the LED of Example 1. The results are shown in Table 1. As shown in Table 1, the driving voltage of the LED of Comparative Example 2 for 20 mA was 3.2 V, and the optical output of the light having the emission wavelength of 460 nm was 2.2 mW.

Comparative Example 3

Figure 7:
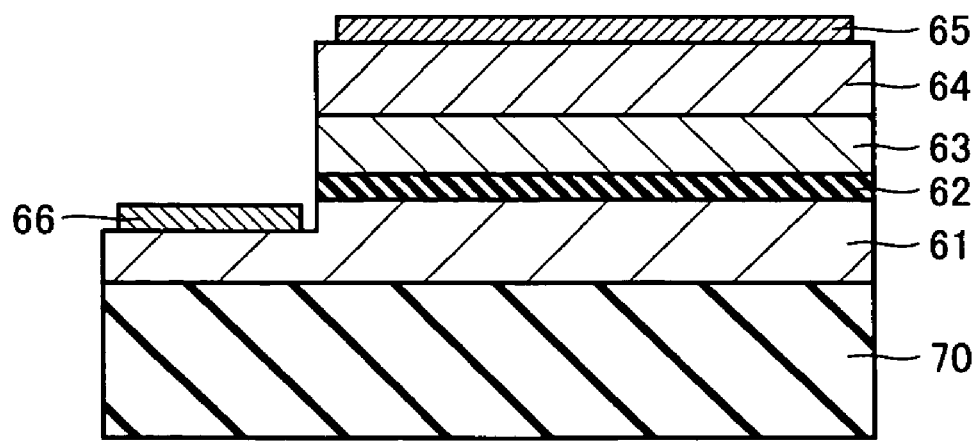
FIG. 7 is a schematic cross sectional view showing a configuration of an LED of Comparative Example 3.

FIG. 7 shows a schematic cross sectional view of a configuration of the LED of Comparative Example 3. The LED of Comparative Example 3 is configured such that a 1.5 μm-thick n-type GaN layer 61, a multiple quantum well active layer 62 having 3 nm-thick In$_{0.2}$Ga$_{0.8}$N layer and 15 nm-thick GaN layer stacked alternately in five layers, a 30 nm-thick p-type Al$_{0.15}$Ga$_{0.85}$N layer 63, and a 100 nm-thick p-type GaN layer 64 are stacked in this order by MOCVD on the surface of a sapphire substrate 70 in a rectangular plate shape having a width of 400 μm, a length of 300 μm and a thickness of 200 μm (absorption coefficient of light of 375 nm wavelength: 2 cm$^{-1}$; absorption coefficient of light of 500 nm wavelength: 2 cm$^{-1}$; surface roughness Ra of the surface: 3 nm), and a stack of Au layer and Ni layer is formed on p-type GaN layer 64 as a p-side electrode 65 (with the Au layer arranged on the p-type GaN layer 64 side), and a cylindrical stack of Ti layer and Al layer having a diameter of 80 μm is formed on an exposed surface of n-type GaN layer 61 as an n-side electrode 66 (with the Ti layer arranged on the n-type GaN layer 61 side).

In the LED of Comparative Example 3, the contact surface between n-type GaN layer 61 and multiple quantum well active layer 62 is in a rectangular shape with a width of 300 μm and a length of 300 μm, as in the cases of Examples 1-4 and Comparative Examples 1-2.

The driving voltage and the optical output of the LED of Comparative Example 3 were evaluated. The results are shown in Table 1. As shown in Table 1, the driving voltage of the LED of Comparative Example 3 for 20 mA was 3.7 V, and the optical output of the light having the emission wavelength of 460 nm was 4.9 mW.

TABLE 1

|  |  | Example 1 | Example 2 | Example 3 | Example 4 | Comparative Example 1 | Comparative Example 2 | Comparative Example 3 |
|---|---|---|---|---|---|---|---|---|
|  | Number of GaN buffer layers grown | 2 | 2 | 2 | 2 | 2 | 1 | Sapphire substrate |
| GaN crystal substrate | Dopant type | oxygen | oxygen | silicon | sulfur | none | oxygen |  |
|  | Carrier concentration (cm$^{-3}$) | $5 \times 10^{17}$ | $2 \times 10^{19}$ | $5 \times 10^{17}$ | $5 \times 10^{17}$ | $1 \times 10^{17}$ | $2 \times 10^{19}$ |  |
|  | Surface roughness Ra (nm) | 3 | 3 | 3 | 3 | 3 | 3 | 3 |
|  | Absorption coefficient of light of 375 nm wavelength (cm$^{-1}$) | 34 | 68 | 35 | 39 | 26 | 110 | 2 |
|  | Absorption coefficient of light of 500 nm wavelength (cm$^{-1}$) | 7 | 10 | 8 | 10 | 4 | 25 | 2 |
| LED | Driving voltage (V) | 3.3 | 3.2 | 3.3 | 3.4 | 5.4 | 3.2 | 3.7 |
|  | Optical output (mW) | 4.8 | 3.5 | 4.7 | 4.5 | 5.0 | 2.2 | 4.9 |

As shown in Table 1, the LEDs of Examples 1-4 fabricated using the GaN crystal substrates of Examples 1-4, having a diameter of not less than 20 mm and a thickness of not less than 70 μm and not more than 450 μm, and having the light absorption coefficient of not less than 7 cm$^{-1}$ and not more than 68 cm$^{-1}$ for the light in the wavelength range of not less than 375 nm and not more than 500 nm, each have a low driving voltage of 3.2 V to 3.4 V, and high optical output of 3.5 mW to 4.8 mW. Accordingly, it has been confirmed that the LEDs of Examples 1-4 are low in driving voltage and high in optical output.

Further, as shown in Table 1, the LED of Comparative Example 1 fabricated using the GaN crystal substrate of Comparative Example 1, having a small light absorption coefficient of 4 cm$^{-1}$ for the light of 500 nm wavelength, has a large driving voltage of 5.4 V. This is presumably because the carrier concentration of the GaN crystal substrate of Comparative Example 1 is too small, leading to a high electric resistance.

Furthermore, as shown in Table 1, the LED of Comparative Example 2 fabricated using the GaN crystal substrate of Comparative Example 2, having a large light absorption coefficient of 110 cm$^{-1}$ for the light of 375 nm wavelength, has small optical output of 2.2 mW. This is presumably because the GaN crystal substrate of Comparative Example 2 has a high light absorption coefficient for the light having the emission wavelength of 460 nm.

Still further, as shown in Table 1, it has been confirmed that the LED of Comparative Example 3 fabricated using the sapphire substrate has the driving voltage higher than those of Examples 1-4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A GaN crystal substrate having a diameter of not less than 20 mm and a thickness of not less than 70 μm and not more than 450 μm, wherein said GaN crystal substrate has a light absorption coefficient of not less than 34 cm$^{-1}$ and not more than 68 cm$^{-1}$ for light in a wavelength of 375 nm and a light absorption coefficient of not less 7 cm$^{-1}$ and not more than 10 cm$^{-1}$ for light in a wavelength of 500 nm, wherein said GaN crystal substrate includes at least one element selected from the group consisting of oxygen, carbon, sulfur and silicon, as a dopant.

2. The GaN crystal substrate according to claim 1, wherein a carrier concentration of said GaN crystal substrate is not less than $5 \times 10^{17}$ cm$^{-3}$ and not more than $2 \times 10^{19}$ cm$^{-3}$.

3. The GaN crystal substrate according to claim 1, wherein a surface of said GaN crystal substrate has an average surface roughness Ra of not more than 10 nm.

4. A method for fabricating the GaN crystal substrate as recited in claim 1, comprising the steps of:
   forming a mask layer having an opening on a GaAs substrate;
   growing at least two GaN buffer layers on a surface of said GaAs substrate exposed at said opening;
   epitaxially growing a GaN crystal layer on said GaN buffer layers by HVPE; and
   removing the GaAs substrate.

5. A light-emitting device fabricated by a method comprising the step of forming at least one III group nitride semiconductor layer on the GaN crystal substrate as recited in claim 1.

6. The method for fabricating the GaN crystal substrate according to claim 4, wherein said GaN crystal substrate includes oxygen as a dopant, and
   wherein epitaxially growing said GaN crystal layer on said GaN buffer layers by HVPE uses a mixed gas including $O_2$ and $N_2$.

7. The method for fabricating the GaN crystal substrate according to claim 4, wherein said GaN crystal substrate includes silicon as a dopant, and
   wherein epitaxially growing said GaN crystal layer on said GaN buffer layers by HVPE uses a mixed gas including $SiH_4$ and $N_2$.

8. The method for fabricating the GaN crystal substrate according to claim 4, wherein said GaN crystal substrate includes oxygen as a dopant, and
   wherein epitaxially growing said GaN crystal layer on said GaN buffer layers by HVPE uses a mixed gas including $H_2S$ and $N_2$.

* * * * *